United States Patent
Reinold et al.

(10) Patent No.: US 7,582,832 B2
(45) Date of Patent: Sep. 1, 2009

(54) BOND AND METHOD FOR BONDING TWO CONTACT SURFACES

(75) Inventors: Manfred Reinold, Schwieberdingen (DE); Thomas Kaden, Schwieberdingen (DE); Immanuel Mueller, Gomaringen (DE)

(73) Assignee: Robert Bosch GmbH, Stuttgart (DE)

( * ) Notice: Subject to any disclaimer, the term of this patent is extended or adjusted under 35 U.S.C. 154(b) by 16 days.

(21) Appl. No.: 11/810,266

(22) Filed: Jun. 4, 2007

(65) Prior Publication Data

US 2008/0006437 A1 Jan. 10, 2008

(30) Foreign Application Priority Data

Jun. 2, 2006 (DE) .................. 10 2006 025 867

(51) Int. Cl.
*H01R 4/18* (2006.01)

(52) U.S. Cl. .................................. 174/94 R

(58) Field of Classification Search ............... 174/94 R, 174/268

See application file for complete search history.

(56) References Cited

U.S. PATENT DOCUMENTS

| | | | | |
|---|---|---|---|---|
| 5,139,192 A | * | 8/1992 | Simmonds | 228/179.1 |
| 5,148,262 A | * | 9/1992 | Ahonen et al. | 174/125.1 |
| 5,299,726 A | * | 4/1994 | Sauer | 228/111.5 |
| 6,293,803 B1 | * | 9/2001 | Rust et al. | 439/33 |

FOREIGN PATENT DOCUMENTS

DE   199 10 418   9/2000

* cited by examiner

*Primary Examiner*—Chau N Nguyen
(74) *Attorney, Agent, or Firm*—Kenyon & Kenyon LLP

(57) ABSTRACT

A bond between two contact surfaces using at least two bonding wires, as well as a method for producing such a bond. The bonding wires are positioned one above the other and are conductively interconnected.

10 Claims, 1 Drawing Sheet

BOND AND METHOD FOR BONDING TWO CONTACT SURFACES

BACKGROUND INFORMATION

Bonding wires having a circular cross section or bonding wires in the form of ribbons are used for producing bonds. Bonding wires are lead wires for microelectronic components such as integrated circuits or LEDs. Particularly in microelectronic assembly and interconnection technology, the bonding wire is usually made of gold or a gold alloy. However, bonding wires made of aluminum having some small silicon content are also used. Bonding wires having a circular cross section are used especially for transmitting low current intensities. For example, in the case of a chip, the bonding wires connect the pins visible from the outside to the pads located in the interior of the chip. The diameters of such bonding wires having a circular cross section are mostly in the range between 25 and 50 µm. In power electronics, for the most part nearly pure aluminum bonding wires are used. Ribbon bonding wires are especially suitable for transmitting high current intensities. However, bonding wires having a circular cross section are also used in this area, the diameter of the bonding wires for this application area being roughly between 125 and 500 µm, depending on the current load to be transmitted.

In order to be able to transmit high current loads, it is known to position a plurality of bonding wires side by side. Such a setup is described, for example, in German Patent Application No. DE 199 10 418. In that case, each bonding wire is welded to the two contact surfaces to be connected. To that end, large contact surfaces are needed for accommodating the bonding wires. However, the space for accommodating a plurality of side-by-side bonding wires is not available in the case of many applications.

SUMMARY OF THE INVENTION

An object underlying the present invention is to provide a bond that is suitable for accommodating high current loads, accompanied by a small area expanse. A further objective is to provide a method for producing such a bond.

The present invention is based on the idea of positioning a plurality of bonding wires one above the other, and thereby to reduce the area expanse. The superposed bonding wires are electroconductively connected to each other, preferably are welded together. The greater the number of superposed ribbons, the greater the current carrying capacity of the bond according to the present invention. The current carrying capacity may be increased further by increasing the width and/or thickness, i.e., the diameter of the bonding wires.

In refinement of the present invention, advantageously the bonding wire situated right at the bottom is conductively joined, preferably welded, especially ultrasonically welded, to the contact surfaces to be connected. Thus, the current to be transmitted flows from a contact surface into the lowest bonding wire, and from there into the at least one bonding wire situated above it, thus situated with distance to the contact surface. The area expanse of the bond according to the present invention is thereby particularly small.

According to a preferred embodiment of the present invention, the superposed bonding wires are electrically joined to each other by welding, especially ultrasonic welding. In this context, the welding may be carried out semiautomatically or fully automatically.

To obtain a bond which is as flexible as possible, and therefore resistant to stress from vibration or temperature fluctuation, the superposed bonds are not joined to each other over the whole surface, but rather only at locations set apart from each other in the longitudinal direction of the bonding wires. Preferably, the bonding wires are welded together exclusively in the area of their free ends. Therefore, the bonding-wire sections located between the weld points are able to move relative to each other, and therefore to compensate for changes in length because of temperature fluctuations, without the welded connection rupturing or breaking.

It is particularly advantageous if the bond includes at least one bonding wire taking the form of a ribbon and having an at least approximately rectangular cross-sectional area. Preferably all the bonding wires of the bond are in the form of ribbon bonding wires. In this way, the contact surface between the ribbons and the contact surface between the contact surfaces to be joined is especially large. Moreover, given identical current carrying capacity and identical material, ribbon bonding wires are more flexible than bonding wires having a circular cross section. Because of the flat formation of the sides of the ribbon bonding wires, it is possible to reliably position the bonding wires and weld them together.

In a further refinement of the present invention, the bonding wires of the bond are advantageously dimensioned differently. For example, the upper bonding wires may thereby be formed in such a way that they do not laterally overhang the respective bonding wire(s) situated below them. Preferably, at least one bonding wire situated above the lowest bonding wire is thicker, thus higher, in the direction perpendicular to the contact surfaces than the bonding wire located right at the bottom. The current carrying capacity of the bond is thereby increased overall. For example, if ribbon wires are used as bonding wires, the bond may be pyramid-like, thus, with bonding wires becoming narrower toward the top.

In refinement of the present invention, bonding wires made of different materials are advantageously used for producing the bond. For example, the bonding wire disposed at the very bottom may be made of a material that can be bonded reliably to the material of the contact surfaces to be connected. For instance, an aluminum wire is used as the lowest bonding wire of the bond. Bonding wires having greater current carrying capacity, especially made of copper or gold, for example, may be disposed above the bonding wire at the very bottom.

The subject matter of the present invention is also a method for producing the above-described bond, in which two set-apart contact surfaces, e.g., the contact surface of an integrated circuit and the contact surface of a substrate or pressed screen, etc., are electroconductively interconnected by at least two bonding wires. According to the present invention, a first lower bonding wire is bonded, preferably welded, to the two contact surfaces. Onto this lower bonding wire, at least one further bonding wire is bonded that is set apart from the two contact surfaces. The bonding wire at the very bottom is thus disposed between the contact surfaces and the bonding wire situated above it. The first bond foot of the second bonding wire is bonded onto the first, already-bonded bond foot of the lowest bonding wire, and the second bond foot of the second bonding wire is bonded onto the second, already-bonded bond foot of the lowest bonding wire. The procedure is analogous with further bonding wires located above it.

In refinement of the method according to the present invention, the two bonding wires are bonded together exclusively in the area of their bond feet set apart from each other. Preferably, at least one section of the bonding-wire sections situated in between is set apart from each other, so that in a middle section, the bonding wires are able to move relative to one another. Because air is able to flow through between the bonding wires bonded to each other, waste heat caused by the flow of current can be dissipated.

DETAILED DESCRIPTION

Figure 1:
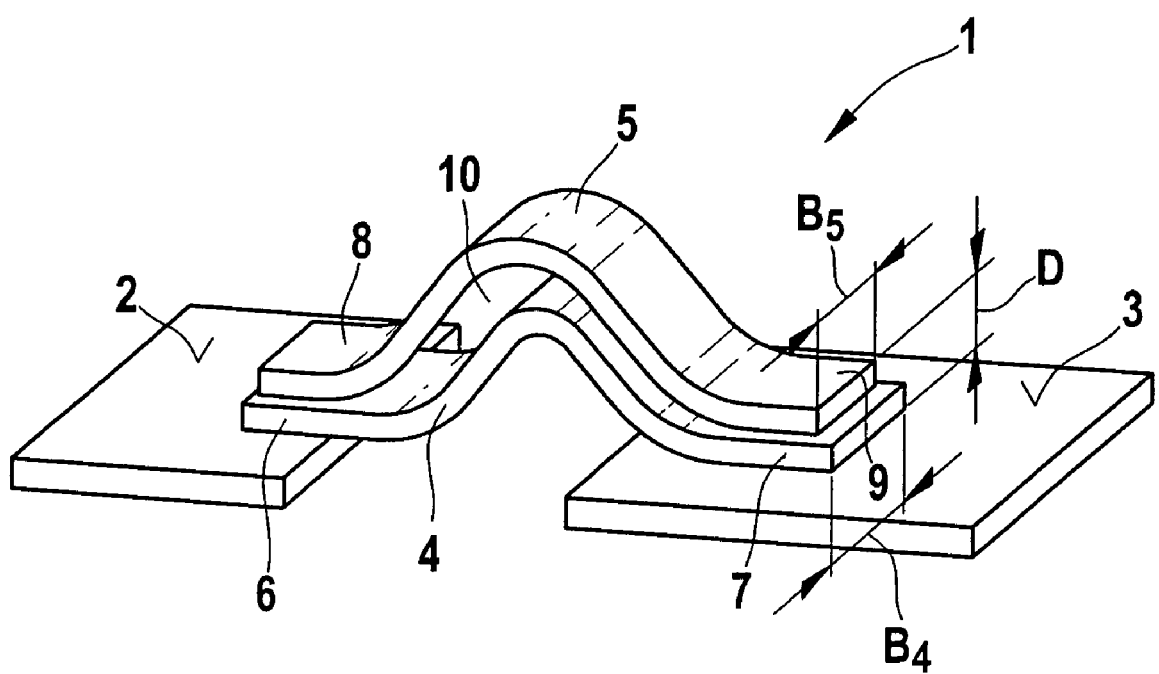
FIG. 1 shows a bond between two contact surfaces, using two superposed bonding wires.

FIG. 1 shows a bond 1 between two contact surfaces 2, 3. In this exemplary embodiment, contact surface 2 is the contact surface of an integrated circuit, and contact surface 3 is the contact surface of a substrate. Thus, both contact surfaces 2, 3 are contact surfaces of microelectronic elements.

Contact surfaces 2, 3 are electroconductively interconnected via two bonding wires 4, 5. According to the present invention, bonding wires 4, 5 are not positioned side by side, but rather one above the other. Thus, upper bonding wire 5 is situated with distance to contact surfaces 2, 3. Direct contact exists only between lower bonding wire 4 and contact surfaces 2, 3.

Both bonding wires 4, 5 are in the form of so-called ribbon bonding wires having an at least nearly rectangular cross-sectional area, width $B_5$ of upper bonding wire 5 being less than width $B_4$ of lower bonding wire 4.

Lower bonding wire 4 is ultrasonically welded in the area of its free ends 6, 7 to contact surfaces 2, 3. Bonding wire 5 situated above it, in the region of its free ends 8, 9 is disposed at least approximately parallel to free ends 6, 7 of bonding wire 4, and is ultrasonically welded directly above the contact area of lower bonding wire 4 to contact surfaces 2, 3 with bonding wire 4. Between these contact areas set apart from each other, the two centrally curved bonding wires 4, 5 are not conductively joined to each other, but rather an air gap 10 exists between them. The air flowing through air gap 10 is able to dissipate resistance heat.

Because of air gap 10, the middle sections of bonding wires 4, 5 are able to shift relative to each other in the longitudinal direction, transverse direction and vertical direction, making the bond extremely stable with respect to stress due to vibration and temperature fluctuation. It is thereby possible to better compensate for changes in length associated with this, particularly due to the influence of heat during the welding process.

In the exemplary embodiment shown, lower bonding wire 4 is made of aluminum, and bonding wire 5 above it is made of copper, and thus, given the same thickness, exhibits higher current carrying capacity than bonding wire 4.

Thickness D of bond 1 can be kept as small as possible by suitable selection of material.

In producing the bond of the present invention, first of all lower bonding wire 4 is bonded with its two bond feet, thus with the area of its free ends 6, 7, to contact surfaces 2, 3, whereupon in a next step, narrower bonding wire 5, in this exemplary embodiment made of copper, is bonded with its two bond feet directly above the bond feet of lower bonding wire 4, to it.

Because the two bonding wires 4, 5 are positioned one above the other, the area expanse of bond 1 is small compared to bonding wires disposed side by side, given the same current carrying capacity.

What is claimed is:

1. A bond between two contact surfaces comprising:
   at least two bonding wires, each of the at least two bonding wires having at least two free ends, the bonding wires being situated one above the other and being conductively interconnected at the at least two free ends of each bonding wire;
   wherein the at least two free ends of each bonding wire are located at the contact surfaces; and
   wherein the bonding wires are welded to one another.

2. The bond according to claim 1, wherein only a lowest of the bonding wires is joined directly to the contact surfaces.

3. The bond according to claim 1, wherein only a lowest of the bonding wires is welded directly to the contact surfaces.

4. The bond according to claim 1, wherein the bonding wires are ultrasonically welded to one another.

5. The bond according to claim 1, wherein the bonding wires are joined to each other at at least two locations set apart from each other in a longitudinal direction of the bonding wires, in an area of free ends.

6. The bond according to claim 1, wherein at least one of the bonding wires is in the form of ribbons having an at least substantially rectangular cross-sectional area.

7. The bond according to claim 1, wherein the bonding wires are dimensioned differently.

8. The bond according to claim 7, wherein a lower of the bonding wires is at least one of wider and thinner than at least one of the bonding wires situated above it.

9. The bond according to claim 1, wherein the bonding wires are made of different materials.

10. A bond between two contact surfaces comprising:
    at least two bonding wires, each of the at least two bonding wires having at least two free ends, the bonding wires being situated one above the other and being conductively interconnected at the at least two free ends of each bonding wire;
    wherein the at least two free ends of each bonding wire are located at the contact surfaces;
    wherein the bonding wires are joined to each other at at least two locations set apart from each other in a longitudinal direction of the bonding wires, in an area of free ends; and
    wherein the joining is by welding.

* * * * *